United States Patent [19]

Raychaudhuri

Best Available Copy

[11] E Re. 30,412

[45] Reissued Oct. 7, 1980

[54] CdTe BARRIER TYPE PHOTOVOLTAIC CELLS WITH ENHANCED OPEN-CIRCUIT VOLTAGE, AND PROCESS OF MANUFACTURE

[75] Inventor: Pranab K. Raychaudhuri, Rochester, N.Y.

[73] Assignee: Eastman Kodak Company, Rochester, N.Y.

[21] Appl. No.: 33,615

[22] Filed: Apr. 26, 1979

Related U.S. Patent Documents

Reissue of:

[64] Patent No.: 4,035,197
Issued: Jul. 12, 1977
Appl. No.: 671,866
Filed: Mar. 30, 1976

U.S. Applications:

[63] Continuation of Ser. No. 885,050, Mar. 9, 1978, abandoned.

[51] Int. Cl.[3] ..... H01L 31/06

[52] U.S. Cl. ..... 136/255; 136/258; 136/260; 29/572; 250/211 J; 250/212; 357/15; 357/30; 427/76

[58] Field of Search ..... 136/89 SJ, 89 CD, 89 TF; 250/211 J, 212; 357/15, 30; 29/572; 427/76

[56] References Cited

U.S. PATENT DOCUMENTS

| | | | |
|---|---|---|---|
| 3,703,408 | 11/1972 | Belasco et al. | 427/75 |
| 3,769,558 | 10/1973 | Lindmayer | 357/52 |
| 3,793,069 | 2/1974 | Shimizu et al. | 427/76 |
| 3,811,954 | 5/1974 | Lindmayer | 136/89 |
| 3,888,697 | 6/1975 | Bogus et al. | 136/89 |

OTHER PUBLICATIONS

R. J. Stirn et al., "A 15% Efficient Antireflection-Coated Metal-Oxide-Semiconductor Solar Cell," *App. Phys. Lett.*, vol. 27, pp. 95-97, Jul. 1975.

E. J. Charlson et al., "An Al-p-Silicon MOS Photovoltaic Cell," *J. Appl. Phys.*, vol. 46, pp. 3982-3987, Sep. 1975.

Y. M. Yeh et al., "Improved Schottky Barrier Solar Cells," Presented at 11th Photovoltaic Specialists Conf., May 1975 (Conf. Record, pp. 391-397).

P. Goerlich et al., *Optik* 4, Buch 2/3, pp. 206-212 (1948).

R. O. Bell et al., "A New Look at CdTe Solar Cells," Presented at 11th Photovoltaic Specialists Conf., May 1975 (Conference Record, pp. 497-502).

J. Loferski, "Recent Research on Photovoltaic Solar Energy Converters," *Proceedings IEEE,* pp. 667-674, May 1963.

R. J. Stirn et al., "The AMOS Cell-An Improved Metal-Semiconductor Solar Cell," Presented at 11th Photovoltaic Specialists Conf., May 1975 (Conf. Record, pp. 437-438).

R. W. Aldrich et al., "Improved CdTe Solar Cell and Array-Environmental Effects Investigation," General Electric Tech. Report AFAPL-TR-69-32, pp. 60-68.

*Primary Examiner*—Aaron Weisstuch
*Attorney, Agent, or Firm*—Dana M. Schmidt

[57] ABSTRACT

A cadmium telluride photovoltaic cell is produced with increased conversion efficiency arising from enhanced open-circuit voltage. Such voltage is achieved by altering the surface of the crystalline cadmium telluride that contacts the barrier metal by heating the cadmium telluride in the presence of oxygen prior to depositing the barrier metal.

10 Claims, 1 Drawing Figure

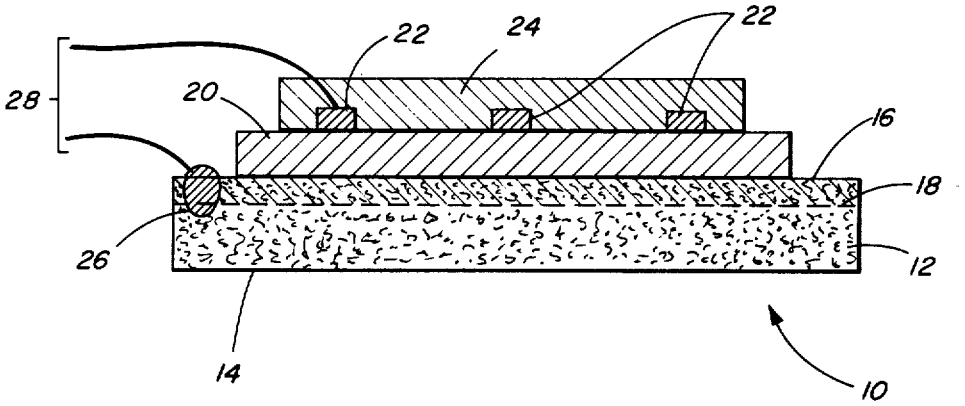
22
24
22
28
20
16
18
26
12
14
10

CdTe BARRIER TYPE PHOTOVOLTAIC CELLS WITH ENHANCED OPEN-CIRCUIT VOLTAGE, AND PROCESS OF MANUFACTURE

Matter enclosed in heavy brackets [ ] appears in the original patent but forms no part of this reissue specification; matter printed in italics indicates the additions made by reissue.

*This application is a continuation application of U.S. reissue application S.N. 885,050, filed on Mar. 9, 1978, now abandoned, as a reissue for U.S. Pat. No. 4,035,197, issued on July 12, 1977, on U.S. Application S.N. 671,866, filed on Mar. 30, 1976.*

BACKGROUND OF THE INVENTION

1. Field of the Invention

This invention relates to barrier type photovoltaic cells useful for converting light and particularly solar energy into electrical energy.

2. State of the Prior Art

So-called Schottky barrier photocells rely upon the fact that certain metals, i.e., those having an appropriate work function, form a rectifying contact when appropriately contacted with a suitable semiconductor material. Electron-hole pairs generated by the absorption of light in the semiconductor are separated due to the field at the metal-semiconductor junction, establishing an electrical potential. In common with most of the early photocells, however, such cells had low conversion efficiencies due to the rather low open-circuit voltages that were produced. It is well-known that the conversion efficiency is a direct mathematical function of the open-circuit voltage.

Early attempts to manufacture barrier-type photovoltaic cells included devices formed by vacuum depositing metal onto cadmium telluride. Cadmium telluride has long been known to be an optimum material for photocells because its band gap is closest to that which will accommodate the optimum amount of solar energy. As explained in General Electric Technical Report AFAPL-TR69-32, gold was one of the metals thoroughly studied. However, this initial work concluded that preheating the cadmium telluride in oxygen pursuant to the methods of the prior art gave no enhancement of the photocell properties.

More recent developments have raised a question about the earlier conclusion that preheating the semiconductor yields an ineffective enhancement, at least with regard to gallium arsenide as the semiconductor material. It was reported in Applied Physics Letters, Vol. 27, July 1975, pages 95–97, that the open-circuit voltage of a gold-coated GaAs cell was improved about 200 mV by heating the semiconductor in air up to 200° C. for 4 to 70 hours prior to coating with gold. However, a subsequent paper by the same authors, entitled "The AMOS Cell—An Improved Metal-Semiconductor Solar Cell," presented at the Eleventh Photovoltaic Specialist Conference at Scottsdale, Ariz. on May 6–8, 1975, reported that the results were not reproducible no matter what temperature or what length of time were used, particularly when a different source of oxygen, such as pure oxygen, was used. Instead, an additional undisclosed element was said to be required for maximum enhancement.

Although some success may have been achieved by preheating GaAs, the art has been discouraged from attempting to preheat other semiconductor materials by publications such as "Improved Schottky Barrier Solar Cells" published by the authors noted above at the aforesaid Eleventh Photovoltaic Specialists Conference, page 391. It is well-known that the open-circuit voltage ($V_{OC}$) of a photovoltaic cell can be expressed as the equation $$V_{OC} = \frac{nkT}{q} \ln\left(\frac{I_L}{A^* T^2}\right) + \frac{n\phi_B}{q} \quad (1)$$

where n = the diode factor k = the Boltzmann constant

T = the absolute temperature q = the electronic charge $I_L$ = the light-generated current $A^*$ = the modified Richardson's constant, and $\phi_B$ = equilibrium barrier height.

It can be shown that, for an untreated n-type GaAs cell coated with gold, the predicted untreated value is about 500 mV, which compares favorably with actual experimental values. However, it can also be shown, using equation (1), that the calculated value for untreated n-type CdTe coated with gold is only about 200 mV so that, even if an increase of 200 mV as was achieved in GaAs devices could be achieved for CdTe by preheating, the resultant 400 mV would not reach the untreated value for GaAs.

Silicon barrier solar cells have been formed wherein the silicon surface was oxidized prior to coating with the barrier metal, either deliberately or by reason for example of the heating step used to fuse the ohmic metal contact to the opposite surface. Such devices resulted in an enhanced $V_{OC}$ value, as is shown, for example, in J. of Applied Physics, Vol. 46, No. 9, page 3982, Sept. 1975.

The general background of photovoltaic cells, and/or to the use of common features such as grid electrodes, antireflection layers, etc., is described in U.S. Pat. Nos. 3,888,697; 3,703,408, 3,769,558; and 3,811,954. Articles pertaining to such general background include "A New Look at CdTe Solar Cells", Bell and Wald, Eleventh Photovoltaic Specialist Conference, supra at page 497; and "Recent Research on Photovoltaic Solar Energy Converters", Loferski, 1963 Proceedings of the IEEE, page 667.

OBJECTS OF THE INVENTION

It is an object of the invention to provide a photovoltaic cell and process for making it wherein the open-circuit voltage of a cadmium telluride barrier-type cell is appreciably enhanced.

It is a related object of the invention to optimize the enhancement of the open-circuit voltage, and therefore to increase the conversion efficiency, of such photovoltaic cells.

Other objects and advantages will become apparent upon reference to the following Summary of the Invention and Description of the Preferred Embodiments, when read in light of the attached drawing.

SUMMARY OF THE INVENTION

The invention concerns a novel barrier-type photovoltaic cell and method of making it. It was unexpectedly discovered that preheating cadmium telluride in the presence of an oxygen containing atmosphere does in fact enhance the open-circuit voltage. More specifically, there is provided a photovoltaic cell comprising a layer of crystalline cadmium telluride, an exterior surface portion of said layer having [$TeO_2$ in the crystalline lattice] *an oxide form of tellurium* to a depth effective to produce an open-circuit voltage that is enhanced over the open-circuit voltage that is produced [without said $TeO_2$; contiguous with said altered surface,] *by a photovoltaic cell identical in structure except for the layer of cadmium telluride which has in the exterior surface portion only the oxide forms of tellurium resulting from exposing the surface portion to air at room temperature*; a layer of metal *in contact with at least part of the exterior surface portion, the layer being* capable of forming a barrier layer with said cadmium telluride altered surface; and an electrode in ohmic contact with said cadmium telluride.

The preferred method of achieving this result comprises the steps of a. forming a layer of crystalline cadmium telluride,
b. heating at least one surface of the layer in an oxygen-containing atmosphere for between about 1 minute and about 20 minutes at a temperature between about 250° C. and about 500° C. to alter the surface; and
c. applying a metal layer in contact with said one surface, said metal being capable of forming a barrier with the altered cadmium telluride, whereby a cell is produced having an open-circuit voltage which is at least about 50 millivolts greater than a similar cell processed without step (b) above.

BRIEF DESCRIPTION OF THE DRAWING

The FIGURE is a section view of a photovoltaic cell prepared in accordance with the invention.

DESCRIPTION OF THE PREFERRED EMBODIMENTS

Although the invention is hereinafter described particularly with respect to solar cells as the preferred embodiments, it is not limited thereto. Rather, it applies to all barrier type photovoltaic cells using cadmium telluride as the semiconductor material. As used herein, "photovoltaic cell" means a solid state device which produces an electric current in response to light from any source or at any wavelength. Thus the cell of this invention is suitable as a terrestrial roof-top generator or as a light-level measuring device. A cell made with large surface areas by an economic method—such as thin-film deposition or dispersion of microcrystals with or without a binder—would be suitable for rooftop generators. As a light-level measuring device, the cell can be used both at high and low light levels. The cell exhibits a moderately high open circuit voltage, even in diffused room-light conditions. It is also found that the open circuit voltage varies approximately linearly with the logarithm of the light intensity in the range of about 100–0.01 mW/cm$^2$.

Alternatively, the cell can also be used in the current mode. The current generated in the diffused room-light condition is about 40 $\mu$A/cm$^2$, a large enough current to be measured accurately. The short circuit current can thus become a measure of the light intensity, and the calibrated cell can be used as an exposure meter and find application in cameras. Coupled with a suitable load resistor, the cell can be used to provide power which is proportional to the light intensity, such power being utilized to operate a meter.

As previously explained, considerable unpredicability exists as to which of the methods of enhancing open-circuit voltage ($V_{OC}$) can be used for the various commonly used semiconductor materials. Included in such common materials are Si, GaAs, CdTe, InP, and CdS. This invention is based upon the discovery that the $V_{OC}$ of a cell constructed from a specific semiconductor material, CdTe, is in fact enhanced by preheating in an oxygen-containing atmosphere prior to applying the barrier metal, more than would be predicted from equation (1) above. Since the $V_{OC}$ of the homolog of CdTe, namely CdS, has been found to be unenhanced, the successful enhancement of $V_{OC}$ for CdTe is unexpected.

As used herein, "enhanced $V_{OC}$" is defined as an improvement of at least about 50 millivolts (mV). In practice much larger enhancement, on the order of 200 to 300 mV, is common using the process of the invention.

The $V_{OC}$ of a CdTe cell is enhanced by altering the state of the surface of the semiconductor material which contacts the barrier metal. The effect is produced by heating a surface of the semiconductor material in an oxygen-containing atmosphere and is not limited by the crystalline form of the CdTe. Although hereinafter the discussion will be directed to polycrystalline CdTe, the effect applies equally to single crystals however produced. It is contemplated that the effect can also be achieved with thin film devices.

However, the enhancement effect is a function of the manner in which the CdTe is heated in an oxygen-containing atmosphere. The heat can be applied in the presence of oxygen by using an air furnace, or by using a furnace having controlled atmospheres which can be altered from non-oxidizing to oxidizing. As described herein, when using an air furnace to heat a CdTe material having a freshly prepared surface, prior to the heating step that material is at room temperature. Because of the short heating time involved, it has not been practical in such heating steps to raise the temperature of the semiconductor material slowly towards the desired temperature.

It has been found, for example, that, using an air furnace, heating temperatures of 200° C. or less tend to be inadequate, even with very lengthy heating times. In fact, reproducible results have been observed only when heat is applied at 250° C. or higher. At such temperatures, it has been found that the costly prolonged heating heretofore used, for example, for GaAs, is unnecessary. In fact, it is believed that prolonged heating can be detrimental. Thus, when using an air furnace, the heating need only be applied for more than about 2 minutes and up to about 20 minutes for a temperature range of about 250° C. to about 350° C. If the time of heating is on the short side of this range, higher temperatures are preferred within the temperature range.

It has also been found that in an air furnace, times shorter than 2 minutes may be used; but, temperatures above 350° C. tend to become necessary due to the relatively cool initial semiconductor temperature. Specifically, for times of less than 2 minutes, the heating temperature preferably is at least equal to 490/a, in degrees centigrade, where "a" is the heating time in minutes. Temperatures less than this appear to be insufficient for this time range.

As noted above, the enhancement effect can be achieved equally as well by exposing the cadmium telluride to alternating non-oxidizing and oxidizing atmospheres. For example, an evacuated ampoule containing the semiconductor material can be opened to allow oxygen of the air to interact with the material. It is believed that the amount of oxygen in such an ampoule is reduced sufficiently so as to be essentially non-oxidizing. In such a furnace, altered surface states for CdTe cells can be produced by preheating the semiconductor material to 350° C. in the presence of an essentially non-oxidizing atmosphere until the material is at that temperature, adding oxygen at 350° C. even for times less than 2 minutes, and then removing the material from the effect of the oxygen. It is also contemplated that, after preliminary heating of the semiconductor, oxygen can be introduced into a non-oxidizing atmosphere in a steady stream to flush out the non-oxidizing atmosphere. Removal of the material from oxidation can be achieved by flushing the furnace with a non-oxidizing atmosphere, or simply by removing the material from the furnace. Typical non-oxidizing gases include inert gases such as argon, mildly reducing gases, and $N_2$. Therefore, such controlled atmosphere furnaces have the advantage of permitting lower oxygenating time and/or temperatures to be used due to the preheating of the semiconductor material up to the desired temperature prior to oxygen exposure.

The alternating atmosphere furnace can also be used for heat-treatment in the presence of oxygen without appreciable preheating in the non-oxidizing atmosphere, as will be recognized.

It will be apparent from the preceding discussion that the altered surface state appears to be an oxidation phenomenon. Although it is not essential for the practice of the invention, it has been found that the altered surface [or] *of* the CdTe includes both CdTe and [$TeO_2$] *an oxide form of tellurium.* This has been estimated as a result of electron spectroscopy chemical analysis of the semiconductor material afer forming the altered surface, which revealed that, in the altered surface, the cadmium electron region showed only the one peak indicative of cadmium metal. No cadmium oxide was detected. The tellurium electron region showed two peaks, one of which is indicative of [$TeO_2$] *an oxide form of tellurium* and the other of which is indicative of tellurium. The actual amount of [$TeO_2$] *the oxide form of tellurium* present will of course depend on the surface preparation and other factors that affect the oxidation process.

The FIGURE in the Drawing illustrates a CdTe cell 10 prepared for solar energy conversion and having an enhanced $V_{OC}$ as provided by the above-described process. Layer 12 is CdTe in polycrystalline form, having opposed surfaces 14 and 16. Surface 16 has been altered by the heat treatment described to a depth indicated by dotted line 18. In contact with surface 16 is the barrier metal 20 in layered form. Metals which in theory have a work function that compares favorably with the electron affinity of the n-type CdTe, will provide the necessary barrier. Useful metals include, for example gold, silver, copper, platinum, nickel, chromium, palladium and aluminum. A collecting grid 22 or other suitable electrodes are ohmically attached to metal 20 in a conventional manner. An optional antireflection layer 24 is coated over the grid 22 and the metal 20 with a thickness designed to increase the transmission of light to the metal-semiconductor interface. Such layers 24 are conventional, utilizing a thickness equal to about one-fourth the optimum desired light wavelength to reduce flare. Typical materials for layer 24 include $SnO_x$, where x is less than or equal to 2, and zinc sulfide. Further discussion of such antireflection layers can be found in the literature.

The electronic circuit for the cell is completed by an ohmic contact 26 of metal, such as indium, made through surface 16 to the unaltered CdTe 12. Alternatively, contact 26 can be secured to surface 14. Leads 28 then carry the current, if used in the current mode, or apply the potential, if used in the open circuit mode, to the circuits used in conjunction with the cell.

Each of the elements of the cell previously described can be formed in a variety of ways. The semiconductor layer 12 can be formed by slicing a thin section from a sample formed by hot-pressing techniques or by any other conventional technique, and is doped n-type by the addition of chlorine, bromine, iodine, indium, etc. to the crystals as "impurities;" or by annealing in a suitable vapor, such as cadmium; or by both. P-type doping can be achieved by the appropriate selection of other "contaminants," as is well-known. The amount of doping does not appear to be critical, expect that uniform doping in a conventional manner appears to be desirable. The altered surface 16 is formed as described in detail above, preferably after cleaning the semiconductor layer by etching, abrasion, or the like. The barrier metal may be formed as a layer by vacuum deposition, chemical precipitation, electrochemical deposition, electroless deposition, and the like. Similar techniques can be used to deposit grid 22 and layer 24, except that a mask is preferred in forming the grid. Conventional soldering techniques are sufficient to form contact 26.

The thicknesses of the layers are not believed to be critical. Typical thicknesses include from 1 micrometer to about 2 millimeters for layer 12, and 0.005 to 0.008 micrometers for layer 20. The depth of altered surface layer 16 will vary depending on the heating conditions described above, and has not been accurately measured for each variation. However, optimum thicknesses are believed to be on the order of less than 0.005 micrometers.

EXAMPLES

The following non-exhaustive examples further illustrate the nature of the invention.

EXAMPLE 1

A hot-pressed sample of polycrystalline CdTe was sliced with a wire saw, and a slice was annealed in cadmium vapor for 24 hours at 850° C. to provide an n-type semiconducting substrate. The surfaces of the slice were mechanically polished, then etched in a solution containing bromine in methyl alcohol. To provide the altered surface layer, the slice was heat treated in air in a muffle furnace at 300° C. for 8 minutes. A gold barrier layer about 60 A thick was then vacuum-deposited on the etched and heat-treated surface through a circular mask over an area of 0.23 $cm^2$ by flash evaporation. Copper electrical leads were attached to the gold layer with silver paint and to the CdTe surface by soldering with indium metal to provide ohmic contact. The resulting photovoltaic cell was illuminated through the gold layer with 100 $mW/cm^2$ of light provided by a Kodak Carousel projector, Model 600H, containing a 300 W tungsten-halogen lamp (General Electric ELH). The open circuit voltage of the cell was 770 mV and the conversion efficiency was 6.4 percent.

As a control, another polycrystalline gold/CdTe photovoltaic cell prepared in a manner similar to Example 1, but without the heat-treatment, showed a $V_{OC}$ of only 437 mv and a conversion efficiency of 4.7%. The net $V_{OC}$ enhancement, then, was 333 mV.

EXAMPLES 2 and 3

Metal/semiconductor photovoltaic cells were prepared as in Example 1, Example 2 being with and Example 3 being without heat-treatment, except that both examples used a chlorine-doped single-crystal CdTe substrate and nickel as the barrier metal. Under the same illumination as in Example 1, the cell made from the heat-treated CdTe single crystal, Example 2, gave an open circuit voltage of 610 mV and a conversion efficiency of 3.4 percent. The cell made from single-crystal CdTe without heat-treatment, Example 3, showed an open circuit voltage of only 258 mV and a conversion efficiency of 2.2 percent. The remarkable effect of the heat treatment of the semiconductor substrate prior to barrier metal deposition in increasing both the open circuit voltage and the conversion efficiency is demonstrated by these examples.

EXAMPLES 4–22

In each of these examples, cells were prepared in a manner similar to Example 1, except that the time and temperature for preheating the CdTe was varied. The $V_{OC}$ and the enhancement for each example are listed in the following Table I. Measurements of $V_{OC}$ without heat treatment were made, in some instances, by grinding away the barrier metal after heat treatment and measurement, etching the semiconductor surface, reforming the barrier metal layer without forming the altered surface, and remeasuring $V_{OC}$. Examples 4 and 5 are examples of no enhancement when the formula 490/a was not followed when heating in an air furnace for only 1 minute. Example 6 illustrates the successful temperature of 490° C. for the condition of 490/a, where a=1 minute.

TABLE I

| Ex. | Heating Temp. (°C.) | Heating Time (min) | $V_{OC}$ (mV) After Treatment | Amount of $V_{OC}$ Increase (mV) |
|---|---|---|---|---|
| 4 | 400 | 1 | ~400 | 0 |
| 5 | 450 | 1 | 405 | −67 |
| 6 | 490 | 1 | 633 | 161 |
| 7 | 400 | 1.5 | 630 | 189 |
| 8 | 400 | 2 | 800 | 410 |
| 9 | 450 | 2 | 720 | 248 |
| 10 | 350 | 4 | 457 | 57 |
| 10 | 350 | 4 | 692 | 302 |
| 11 | 320 | 6 | 609 | 148 |
| 12 | 300 | 8 | 550 | 78 |
| 13 | 250 | 8 | 580 | 162 |
| 14 | 300 | 8.5 | 712 | 251 |
| 15 | 300 | 9 | 697 | 226 |
| 16 | 290 | 9 | 728 | 251 |
| 17 | 280 | 9 | 605 | 215 |
| 18 | 275 | 10 | 733 | 315 |
| 19 | 275 | 11 | 580 | 112 |
| 20 | 300 | 12 | 640 | 179 |
| 21 | 275 | 14 | 561 | 121 |
| 22 | 240 | 20 | 750 | 278 |

These examples revealed that, for an air furnace heat treatment between about 250° and 350° C. and for about 2 to 20 minutes, $V_{OC}$ enhancement is achieved. Further, Examples 6 and 7 demonstrate, in contrast with Examples 4 and 5, that for time a equal to less than 2 minutes, the temperature must be at least 490/a° C.

In the comparison of Examples 10 and 10′, Example 10 appears to be anomalous, possibly due to nonuniform doping. A third preparation of a cell heated at 350° C. for 4 minutes produced an enhancement comparable to that of Example 10′, supporting the conclusion that Example 10 is not a representative example.

EXAMPLE 23

To illustrate that a controlled atmosphere furnace will provide enhancement with 1 to 2 minutes heating in the presence of oxygen without following the formula 490/a, in this example the cell was prepared similarly to that of Example 1, but the semiconductor material was placed after etching in an evacuated ampoule in a furnace set at 350° C. The vacuum level was less than $10^{-4}$ torr, a level believed to be sufficiently lacking in oxygen as to be essentially non-oxidizing. The material was left there for 12 minutes to permit its temperature to rise to 350° C. Thereafter the ampoule was broken to expose the sample to air while retaining the temperature at 350° C. After 1 minutes in the presence of $O_2$, the sample was removed from the furnace and cooled to room temperature. The cell was completed, and $V_{OC}$ when exposed to light in a manner similar to Example 1 was found to be 695 mV. A similar cell wherein the semiconductor material was not heated at all had a $V_{OC}$ of only 472 mV.

EXAMPLE 24 AND 25 —COMPARATIVE EXAMPLES

To illustrate that the process of the invention can not be applied by merely using any one of the known semiconductor materials, a cell similar to that described in Example 1 was prepared for each of these examples, except that the semiconductor material was cadmium sulfide, the homolog of CdTe. Polishing and etching was achieved using 5% bromine and 95% methanol from the cell of Example 24, but etching was omitted in Example 25.

In Example 24 without heat-treating, the $V_{OC}$ was 120 mV. The cell was destroyed by grinding off the gold, and the semiconductor layer was heat-treated in an air furnace at 300° C. for 8 minutes. The $V_{OC}$ after heat-treatment was 9 mV, indicating a failure in the solar cell.

In Example 25, the $V_{OC}$ before heat-treating was 9.8 mV, a barely acceptable value. After heat-treating again at 300° C. for 8 minutes, $V_{OC}$ was 10.5 mV, an increase of only 0.7 mV.

EXAMPLE 26—COMPARATIVE EXAMPLE

Example 24 was repeated, except that silver was used as the barrier metal layer. $V_{OC}$ before heat-treating the CdS was 90 mV, and after heat-treating for 8 minutes at 300° C. was only 0.8 mV.

The invention has been described in detail with particular reference to certain preferred embodiments thereof, but it will be understood that variations and modifications can be effected within the spirit and scope of the invention.

What is claimed is:

1. A photovoltaic cell comprising a layer of crystalline cadmium telluride, an exterior surface portion of said layer having [$TeO_2$ in the crystalline lattice] *an oxide form of tellurium* to a depth effective to produce an open-circuit voltage that is enhanced over the open-circuit voltage that is produced [without said $TeO_2$] *by a photovoltaic cell identical in structure except for the layer of cadmium telluride which has in the exterior surface portion thereof only the oxide forms of tellurium resulting from exposing said surface portion to air at room temperature,* a layer of metal in contact with at least part of said exterior surface portion, said layer being capable of forming a barrier with said cadmium telluride [altered] surface *portion;* and an electrode in ohmic contact with said cadmium telluride.

2. The cell as defined in claim 1, and further including an antireflection layer in contact with at least part of said metal layer, said antireflection layer having a thickness that enhances the transmission of light through the cell.

3. The cell as defined in claim 1, and further including a current-conducting grid applied over, and in ohmic contact with, said metal layer.

4. A process for the formation of a photovoltaic cell, the process comprising the steps of a. forming a layer of crystalline cadmium telluride, b. heating at least one surface of the layer in air for more than about 2 minutes and less than or equal to about 20 minutes at a temperature between about 250° C. and about 350° C., or for a time less than or equal to about 2 minutes but at a temperature in centigrade degrees no lower than about 490/a, where a is the time of heating in minutes; and c. applying a metal layer in contact with at least part of said one surface, said metal being capable of forming a barrier with cadmium telluride, whereby a cell is produced having an open-circuit voltage which is at least about 50 millivolts greater than a similar cell processed without step (b) above.

5. A photovoltaic cell comprising a layer of crystalline cadmium telluride, a surface of said layer being altered to contain [tellurium oxide] *an oxide form of tellurium* by heating in an oxygen containing atmosphere for between about 1 minute and about 20 minutes at a temperature between about 250° and about 500° C. the oxygen being present *in the atmosphere* in an amount that is effective to enhance the open-circuit voltage by at least 50 millivolts *compared to the open-circuit voltage of a photovoltaic cell identical in structure except for the layer of cadmium telluride which has in the surface thereof only the oxide forms of tellurium resulting from exposing said surface to air at room temperature,* in contact with at least part of said altered surface, a layer of metal capable of forming a barrier with said cadmium telluride altered surface; and an electrode in ohmic contact with said cadmium telluride.

6. A photovoltaic cell exhibiting an enhanced open circuit voltage, comprising a layer of crystalline cadmium telluride, a surface of said layer being in an altered state achieved by heating in air for more than about 2 minutes and less than or equal to about 20 minutes at a temperature between about 250° C. and about 350° C., or for a time less than or equal to about 2 minutes but at a temperature in centigrade degrees no lower than about 490/a, where a is the time of heating in minutes;

in contact with at least part of said altered surface, a layer of metal capable of forming a barrier with said cadmium telluride altered surface; and an electrode in ohmic contact with said cadmium telluride.

7. A process of measuring light, comprising the steps of a. exposing to light, a photovoltaic cell comprising a layer of crystalline cadmium telluride, an exterior surface portion of said layer having [$TeO_2$ in the crystalline lattice] *an oxide form of tellurium* to a depth effective to produce an open-circuit voltage that is enhanced over the open-circuit voltage that is produced [without said $TeO_2$] *by a photovoltaic cell identical in structure except for the layer of cadmium telluride which has in the exterior surface portion thereof only the oxide forms of tellurium resulting from exposing said surface portion to air at room temperature,* a layer of metal in contact with at least part of said exterior surface portion, said layer being capable of forming a barrier with said cadmium telluride altered surface; and an electrode in ohmic contact with said cadmium telluride, and b. measuring either the open-circuit voltage or short-circuit current generated by the cell.

*8. A photovoltaic cell comprising*

*a layer of crystalline cadmium telluride, a surface of said layer being altered by heating in an oxygen containing atmosphere for between about 1 minute and about 20 minutes at a temperature between about 250° and about 500° C., the oxygen being present in the atmosphere in an amount that is effective to enhance the open circuit voltage by at least 50 millivolts compared to the open-circuit voltage of a photovoltaic cell identical in structure except for the layer of cadmium telluride which has in the surface thereof only the oxide forms of tellurium resulting from exposing said surface to air at room temperature, and*

*in contact with at least part of said altered surface, a layer of metal capable of forming a barrier with said cadmium telluride altered surface; and*

*an electrode in ohmic contact with said cadmium telluride.*

*9. A process for the formation of a photovoltaic cell, the process comprising the steps of*

*a. forming a layer of crystalline cadmium telluride,*

*b. heating at least one surface of the layer in an oxygen containing atmosphere for a time and at a temperature, and in an amount of oxygen, that are effective to enhance the open-circuit voltage by at least 50 millivolts compared to the open-circuit voltage of a photovoltaic cell identical in structure except for the layer of cadmium telluride which has in the surface thereof only the oxide forms of tellurium resulting from exposing said surface to air at room temperature, said temperature being at least about 250° C. and said time being no greater than about 20 minutes,*

*c. applying a metal layer in contact with at least part of said one surface, said metal being capable of forming a barrier with cadmium telluride, and*

*d. ohmically contacting the cadmium telluride with an electrode.*

*10. A process for the formation of a photovoltaic cell, the process comprising the steps of*

*a. forming a layer of crystalline cadmium telluride,*

*b. heating at least one surface of the layer in an oxygen containing atmosphere for between about 1 minute and about 20 minutes at a temperature between about 250° C. and about 500° C., the oxygen being present in the atmosphere in an amount that is effective to enhance the open-circuit voltage by at least 50 millivolts compared to the open-circuit voltage of a photovoltaic cell identical in structure except for the layer of cadmium telluride which has in the surface thereof only the oxide forms of tellurium resulting from exposing said surface to air at room temperature,*

*c. applying a metal layer in contact with at least part of said one surface, said metal being capable of forming a barrier with cadmium telluride, and*

*d. ohmically contacting the cadmium telluride with an electrode.*

* * * * *